(12) United States Patent
Zhang et al.

(10) Patent No.: US 11,742,451 B2
(45) Date of Patent: Aug. 29, 2023

(54) INTEGRATE STRESSOR WITH GE PHOTODIODE USING A SUBSTRATE REMOVAL PROCESS

(71) Applicant: Cisco Technology, Inc., San Jose, CA (US)

(72) Inventors: Xunyuan Zhang, Mechanicsburg, PA (US); Li Li, San Ramon, CA (US); Prakash B. Gothoskar, Allentown, PA (US); Soha Namnabat, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 80 days.

(21) Appl. No.: 17/103,792

(22) Filed: Nov. 24, 2020

(65) Prior Publication Data
US 2022/0165907 A1  May 26, 2022

(51) Int. Cl.
| | | |
|---|---|---|
| *H01L 31/18* | (2006.01) | |
| *H01L 31/0368* | (2006.01) | |
| *H01L 31/105* | (2006.01) | |
| *H01L 31/036* | (2006.01) | |

(52) U.S. Cl.
CPC ........ *H01L 31/1812* (2013.01); *H01L 31/036* (2013.01); *H01L 31/03682* (2013.01); *H01L 31/105* (2013.01); *H01L 31/1808* (2013.01); *H01L 31/1892* (2013.01)

(58) Field of Classification Search
CPC ........... H01L 31/1812; H01L 31/03682; H01L 31/105
See application file for complete search history.

(56) References Cited

U.S. PATENT DOCUMENTS

| | | | | |
|---|---|---|---|---|
| 6,458,619 B1 * | 10/2002 | Irissou | ................. | H01L 31/105 |
| | | | | 438/57 |
| 7,820,525 B2 * | 10/2010 | Hsieh | ................ | H01L 27/14634 |
| | | | | 257/E21.126 |
| 8,633,573 B2 * | 1/2014 | Jain | ....................... | H01L 31/105 |
| | | | | 257/629 |
| 9,978,890 B1 * | 5/2018 | Bayn | ..................... | H01L 31/028 |
| 2006/0110844 A1 | 5/2006 | Lee et al. | | |

(Continued)

FOREIGN PATENT DOCUMENTS

| | | | |
|---|---|---|---|
| CN | 111133590 A | | 5/2020 |
| JP | 2014183194 | * | 9/2014 |

OTHER PUBLICATIONS

Machine translated document (MTL) JP 2014-183194 (Year: 2014).*

(Continued)

*Primary Examiner* — Ahmed N Sefer
(74) *Attorney, Agent, or Firm* — Patterson + Sheridan, LLP

(57) ABSTRACT

The embodiments of the present disclosure describe a stressed Ge PD and fabrications techniques for making the same. In one embodiment, a stressor material is deposited underneath an already formed Ge PD. To do so, wafer bonding can be used to bond the wafer containing the Ge PD to a second, handler wafer. Doing so provides support to remove the substrate of the wafer so that a stressor material (e.g., silicon nitride, diamond-like carbon, or silicon-germanium) can be disposed underneath the Ge PD. The stress material induces a stress or strain in the crystal lattice of the Ge which changes its bandgap and improves its responsivity.

15 Claims, 10 Drawing Sheets

(56) References Cited

U.S. PATENT DOCUMENTS

| | | | | |
|---|---|---|---|---|
| 2008/0185618 | A1* | 8/2008 | Chu | H01L 31/101 257/292 |
| 2009/0256150 | A1* | 10/2009 | Yoon | H01L 27/12 438/34 |
| 2010/0207254 | A1* | 8/2010 | Jain | H01L 31/105 257/629 |
| 2011/0012221 | A1* | 1/2011 | Fujikata | H01L 31/022408 257/458 |
| 2011/0031578 | A1* | 2/2011 | Miura | H01L 31/1124 438/59 |
| 2012/0025265 | A1* | 2/2012 | Ji | H01L 31/103 257/E31.127 |
| 2013/0202005 | A1 | 8/2013 | Dutt | |
| 2014/0035104 | A1* | 2/2014 | Bratkovski | H01L 21/02658 438/480 |
| 2014/0291682 | A1* | 10/2014 | Huang | H01L 31/1075 257/55 |
| 2015/0171259 | A1* | 6/2015 | Hartmann | H01L 31/1804 438/69 |
| 2015/0177458 | A1 | 6/2015 | Bowers et al. | |
| 2015/0249320 | A1 | 9/2015 | Clifton et al. | |
| 2015/0353350 | A1* | 12/2015 | Berthelot | B81C 1/00357 438/50 |
| 2016/0197216 | A1* | 7/2016 | Ji | H01L 31/028 257/465 |
| 2016/0274319 | A1* | 9/2016 | Krasulick | G02B 6/12004 |
| 2017/0063035 | A1* | 3/2017 | Wang | H01S 5/18352 |
| 2017/0125472 | A1* | 5/2017 | Borthakur | H01L 27/1469 |
| 2017/0294550 | A1* | 10/2017 | Cheng | H01L 31/02327 |
| 2018/0308882 | A1* | 10/2018 | Cheng | H01L 31/1812 |
| 2020/0075792 | A1* | 3/2020 | Zhu | H01L 31/1804 |
| 2020/0103680 | A1* | 4/2020 | Ma | G02F 1/025 |
| 2020/0124791 | A1* | 4/2020 | Bayn | H01L 31/02327 |
| 2020/0174186 | A1* | 6/2020 | Westerveld | G01D 5/268 |
| 2020/0174192 | A1* | 6/2020 | Hasan | G02B 6/136 |
| 2020/0192032 | A1* | 6/2020 | Na | G02B 6/4292 |
| 2020/0381316 | A1* | 12/2020 | Lee | H01L 22/32 |
| 2022/0149098 | A1* | 5/2022 | Wang | H01L 27/1463 |

OTHER PUBLICATIONS

Hyun-Yong Yu, Donghyun Kim, Shen Ren, Masaharu Kobayashi, David A. B. Miller, Yoshio Nishi, and Krishna C. Saraswat, "Effect of uniaxial-strain on Ge p-i-n photodiodes integrated on Si," Appl. Phys. Lett. 95, Oct. 2009, 6 pages [Abstract Only].

Y. Lin, D. Ma, K. H. Lee, S. Bao, J. Michel and C. S. Tan, "Extension of Germanium-on-insulator optical absorption edge using CMOS-compatible silicon nitride stressor," 2017 Conference on Lasers and Electro-Optics Pacific Rim (CLEO-PR), Singapore, 2017, pp. 1-5, doi: 10.1109/CLEOPR.2017.8118797. [Abstract Only].

J. Ke, L. Chrostowski and G. Xia, "Stress Engineering With Silicon Nitride Stressors for Ge-on-Si Lasers," in IEEE Photonics Journal, vol. 9, No. 2, pp. 1-15, Apr. 2017, doi: 10.1109/JPHOT.2017.2675401. [Abstract Only].

* cited by examiner

INTEGRATE STRESSOR WITH GE PHOTODIODE USING A SUBSTRATE REMOVAL PROCESS

TECHNICAL FIELD

Embodiments presented in this disclosure generally relate to germanium photodetector, and more specifically, to applying stress to germanium to change an optical absorption edge of the germanium photodetector.

BACKGROUND

Germanium (Ge) photodetectors (PD) integrated with current CMOS silicon photonics platforms typically have a responsivity smaller than 0.8 in C-band (1530-1565 nm wavelength). Boosting a Ge PD's performance in C-band requires improving its optical responsivity. Introducing stress/strain in Ge can effectively extend its optical absorption edge towards longer wavelengths which in turn improves responsivity of a Ge PD responsivity. However, current solutions to introduce stress/strain on the Ge do not consider the fabrication techniques required to build a Ge PDs. Thus, system designers have limited options for depositing a stressor material for inducing stress in the Ge.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure is a method that includes forming a germanium photodetector on a substrate where the germanium photodetector contacts a first side of a first layer in the substrate, removing a portion of the substrate to expose a second side of the first layer opposite the first side, and depositing a stressor material onto the exposed second side where depositing the stressor material induces a stress that changes an optical absorption edge of the germanium photodetector.

Another embodiment presented in this disclosure is a method that includes forming a germanium on a substrate where the germanium and the substrate are disposed in a first wafer, bonding the first wafer to a second wafer, removing a portion of the substrate, and depositing a stressor material onto the substrate where a portion of the substrate remains between the stressor material and the germanium and where depositing the stressor material induces a stress that changes an optical absorption edge of the germanium.

Another embodiment presented in this disclosure is a germanium photodetector that includes a first layer, germanium disposed on the first layer where the first layer and the germanium are doped to form a PIN junction, and a stressor material disposed on an opposite side of the first layer as the germanium where the stressor material induces a stress that changes an optical absorption edge of the germanium.

Example Embodiments

The embodiments of the present disclosure describe a stressed Ge PD and fabrications techniques for making the same. In one embodiment, a stressor material is deposited underneath an already formed Ge PD. To do so, wafer bonding is used to bond the wafer containing the Ge PD to a second, handler wafer. Doing so provides support to remove a substrate of the wafer containing the Ge PD so that a stressor material (e.g., silicon nitride, diamond-like carbon, or silicon-germanium) can be disposed underneath the Ge PD. The stressor material induces a stress or strain in the crystal lattice of the Ge which changes its bandgap and improves its responsivity in the C-band.

In one embodiment, the stressed Ge PD includes a vertical PIN junction. For example, the Ge may be disposed on a first side of a crystalline silicon layer where the Ge and the silicon layer are both doped to generate the PIN junction. The stressor material can be disposed on a second side of the silicon layer opposite the first side on which the Ge is disposed.

Figure 1:
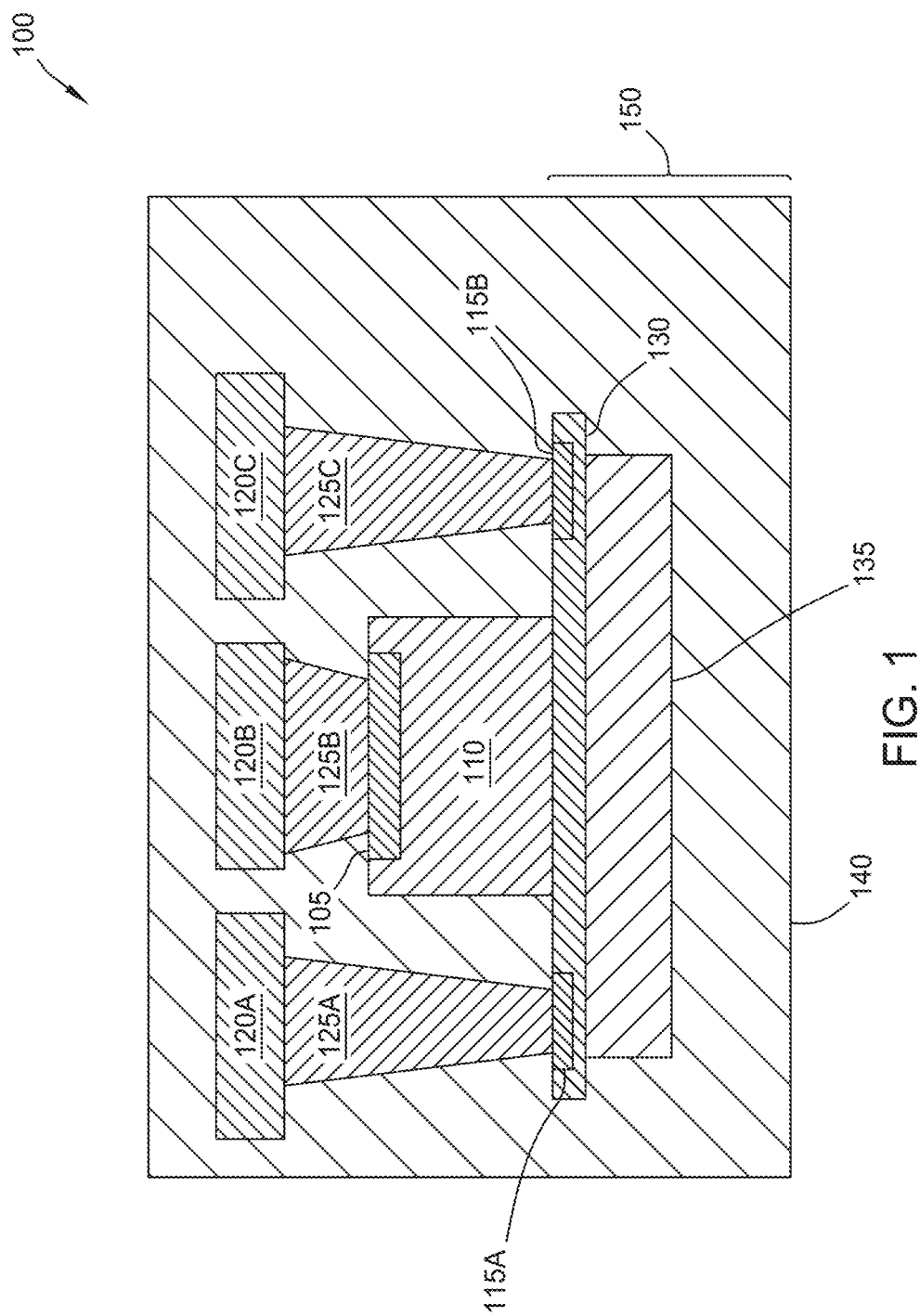
FIG. 1 illustrates a photonic chip with a stressed Ge PD, according to one embodiment disclosed herein.

FIG. 1 illustrates a photonic chip with a stressed Ge PD 100, according to one embodiment disclosed herein. In one embodiment, the stressed Ge PD 100 is implemented in a photonic chip. The Ge PD 100 (or photonic chip) has a substrate 150 that includes an insulator 140, a stressor material 135, and a first layer 130. The insulator 140 can be any suitable insulative material such as an oxide (e.g., silicon dioxide). The stressor material 135, when formed, creates stress (or strain) in the PD 100. For example, the stressor material may generate a compressive stress that causes the PD 100 or photonic chip to bend in a concave or convex manner. As discussed in more detail below, this compressive stress causes stress in Ge 110 which changes the responsivity of the PD 100. The stressor material may be any material that can generate a desired stress in the Ge 110 to change its responsivity such as silicon nitride (SiN), diamond-like carbon, and silicon germanium (SiGe).

As shown, the stressor material 135 is disposed directly beneath the first layer 130, on which the Ge 110 is disposed. In one embodiment, the first layer 130 is a crystalline silicon layer. But in other embodiments, the first layer 130 may be a different semiconductor material. In general, the first layer 130 can be any material suitable to form the Ge 110 thereon and can be doped to form the PD 100. In this example, the first layer 130 is doped to include respective second doped regions 115A and 115B where contacts 125A and 125C connect to the first layer 130. Moreover, the Ge 110 includes a first doped region 105 where contact 125B connects to the Ge 110. The first doped region 105 is doped using a different dopant type than the second doped regions 115A and 115C. For example, the first doped region 105 may be doped N-type while the second doped regions 115A and 115B are doped P-type, or vice versa.

The structure shown in FIG. 1 forms a vertical PIN junction where the first and second doped regions 105 and 115 form the P and N portions of the junction. The remaining portions of the Ge 110 and first layer 130, which may be undoped or only lightly doped, form an intrinsic (I) region of the PIN junction. However, in another embodiment, the entire top portion of the first layer 130 between the second doped regions 115A and 115B may be doped, rather than being undoped or only lightly doped as shown in FIG. 1. In that embodiment, the intrinsic region may be only in the Ge 110.

The contacts 125A-C are connected to respective metal portions 120A-C. Although not shown, further processing steps can be used to connect the metal portions 120A-C (and the underlying first layer 130 and Ge 110) to metal layers disposed above the metal portions 120A-C. The PD 100 may be formed by performing various fabrication steps such as etching or doping as well as depositing or growing additional materials on the first layer 130 such as the Ge 110. Although not shown, the PD 100 may be electrically connected to an integrated circuit mounted onto the photonic chip that receives and processes the electrical signals generated by the PD 100 which correspond to the amount of light absorbed by the Ge 110. In another embodiment, the integrated circuit may be physically separate from a photonic chip containing the PD 100 but is coupled to the photonic chip via a bond wire.

As mentioned above, the stressor material 135 generates a stress in the Ge 110 that improves its responsivity. This stress is generally referred to as a compressive stress since the stressor material 135 is disposed underneath, rather than a side of the Ge 110. In general, the embodiments herein are not limited to any particular type of stress, so long as the stressor material 135 creates some type of stress or strain on the Ge 110 that distorts the lattice structure of the crystalline Ge 110 and changes its bandgap, thereby permitting the Ge 110 to absorb more light at longer wavelengths. This results in a Ge PD 100 with improved responsivity in the C-band than an unstressed Ge PD that does not have the stressor material 135.

In order for the stressor material 135 to stress the Ge 110, the stressor material 135 is formed in the PD 100 after the Ge 110 is formed. It is less challenging to form the stressor material 135 on the sides, or above, the Ge 110 since the stressor material can be added immediately after the Ge 110 is formed and patterned in the photonic chip. However, depositing the stressor material 135 in the substrate 150 calls for a different fabrication process since the Ge 110 is formed on top of the substrate 150. The embodiments below, starting with FIG. 3, describe techniques for forming the stressor material in the substrate 150 using a wafer-to-wafer bond. These embodiments can also be used in tandem with depositing stressor material on other sides of the Ge 110 such as its sides and on top.

Figure 2:
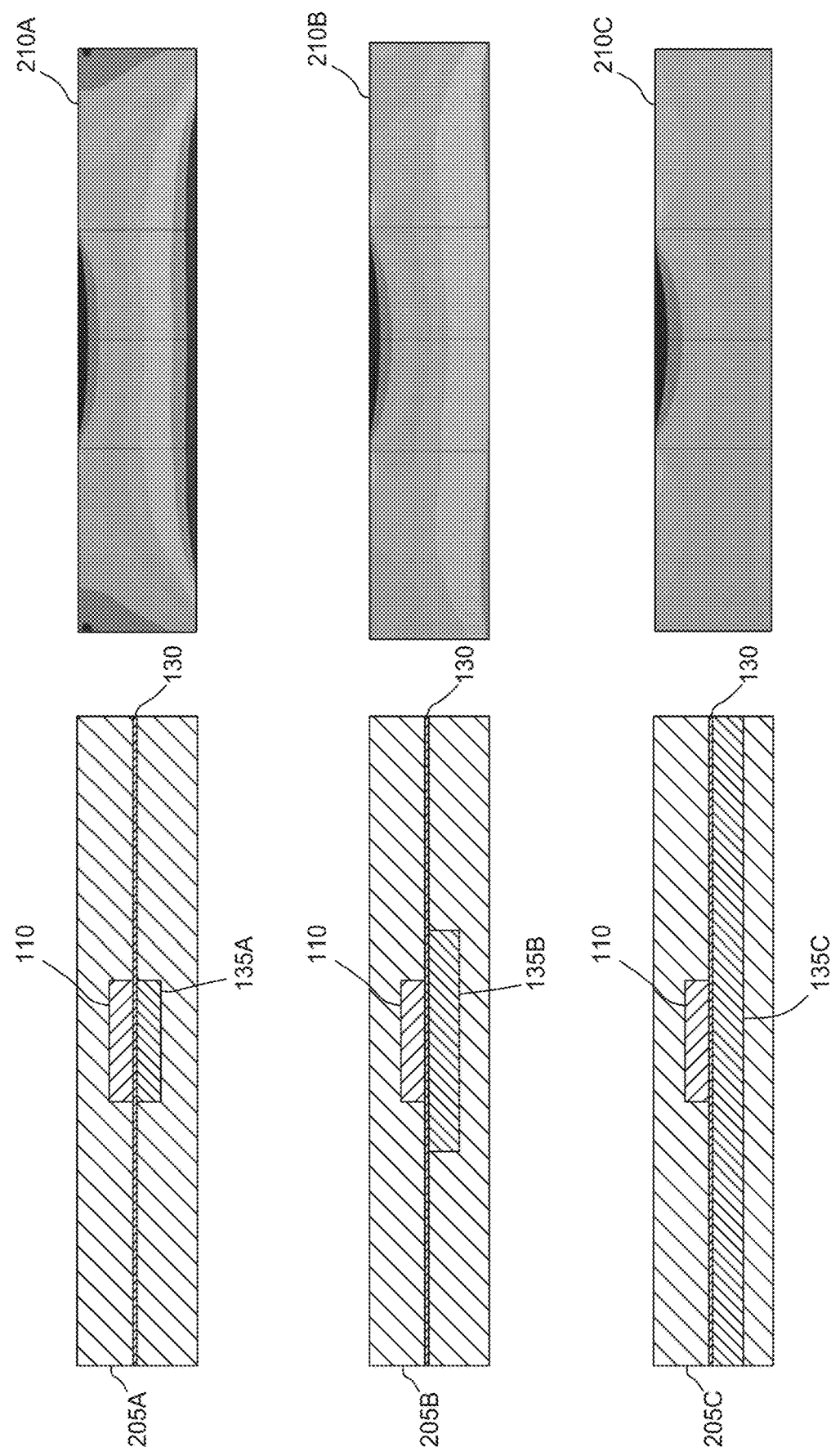
FIG. 2 illustrates different stressor material geometries in order to induce stress in a GE PD, according to one embodiment herein.

FIG. 2 illustrates different stressor material geometries in order to induce stress in a GE PD, according to one embodiment herein. FIG. 2 illustrate three different stressor material geometries in the substrates 205A-C. In the substrate 205A, the width of the stressor material 135A is the same as the Ge 110. In the substrate 205B, the width of the stressor material 135B is slightly greater than the width of the Ge 110. For example, the Ge 110 may have a width of 1-10 nanometers while the stressor material 135B has a width of 5-20 nanometers. In the substrate 205C, the width of the stressor material 135C has a much greater width than the Ge 110. For example, the Ge 110 may have a width of 1-10 nanometers while the stressor material 135B has a width of 20 nanometers or greater (e.g., 100 nanometers or more). Further, all the substrates 205A-C include the first layer 130 that is disposed between the Ge 110 and the stressor materials 135A-C.

FIG. 2 also illustrates, in the right column, stress distributions 210A-C for the substrates 205 in the left column. That is, the stress distribution 210A indicates the stress throughout the substrate 205A caused by the stressor material 135A, the stress distribution 210B indicates the stress throughout the substrate 205B caused by the stressor material 135B, and the stress distribution 210C indicates the stress throughout the substrate 205C caused by the stressor material 135C.

In stress distribution 210A, the Ge 110 and stressor material 135A has the same width (approximately 7 nanometers). This relationship between the Ge 110 and the stressor material 135A results in an approximately 0.4% tensile strain on the Ge 110.

In stress distribution 210B, the stressor material 135B has a width that is approximately 3 nanometers wider than the Ge 110. This relationship between the Ge 110 and the stressor material 135B results in an approximately 0.4% tensile strain on the Ge 110, which might be slightly greater than the strain at the Ge 110 in the stress distribution 210A.

In stress distribution 210C, the stressor material 135C has a width that is approximately 16 nanometers wider than the Ge 110. This relationship between the Ge 110 and the stressor material 135B results in an approximately 0.5% tensile strain on the Ge 110. Thus, the three stress distributions 210A-C show that the stressor material 135 can be designed to apply different stresses on the Ge 110. This stress/strain effectively extends the optical absorption edge of the Ge 110 towards longer wavelengths, thereby improving the responsivity of a PD formed using the Ge 110.

Figure 3:
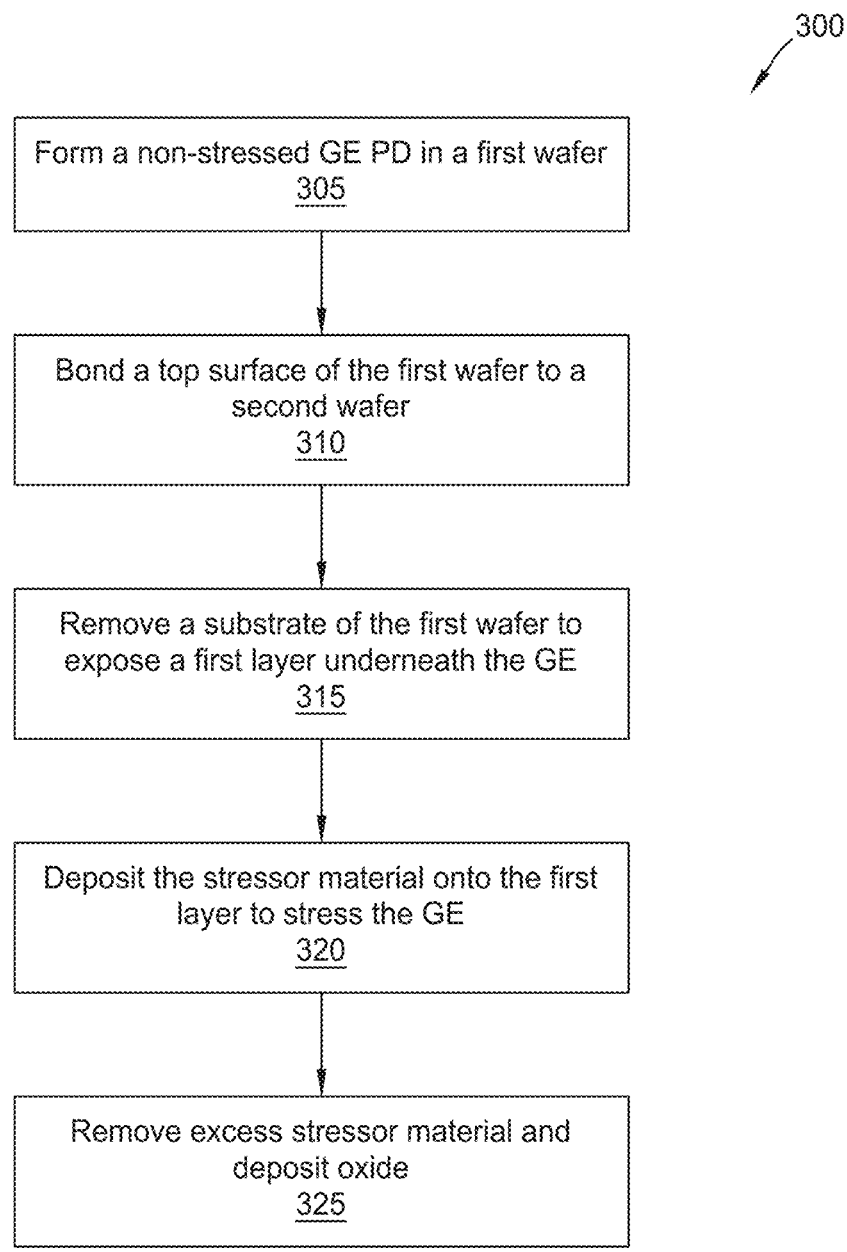
FIG. 3 is a flowchart for fabricating a stressed Ge PD, according to one embodiment described herein.

FIG. 3 is a flowchart of a method 300 for fabricating a stressed Ge PD, according to one embodiment described herein. For clarity, the blocks in the method 300 are described in tandem with FIG. 4A-which 4E illustrate different process steps corresponding to the flowchart in FIG. 3.

Figure 4A:
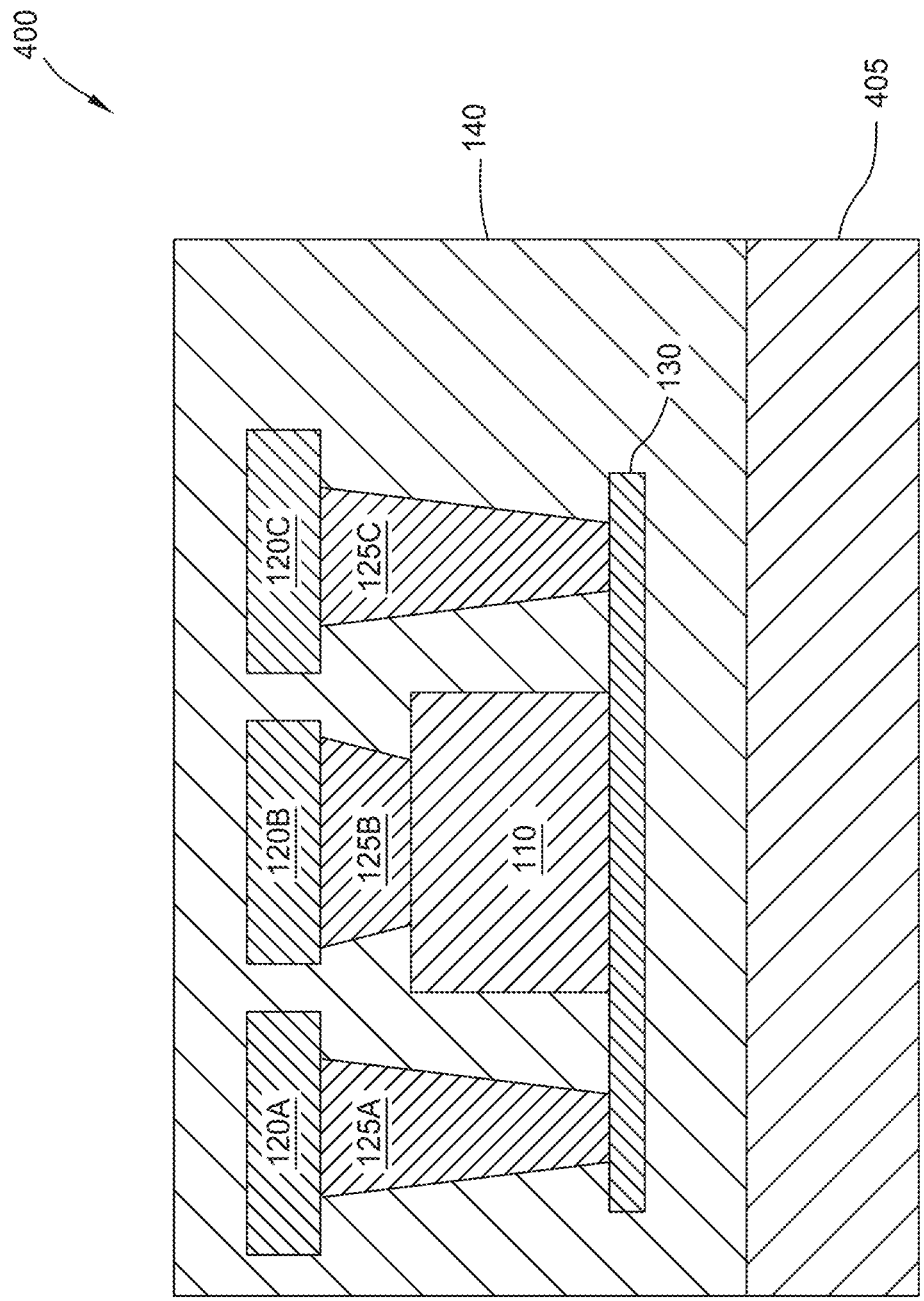
FIGS. 4A-4E illustrate different process steps corresponding to the flowchart in FIG. 3, according to one embodiment described herein.

At block 305, a non-stressed Ge PD is formed in a first wafer. For example, FIG. 4A illustrates a first wafer 400 that includes a Ge PD without any stressor material—i.e., a non-stressed Ge PD. However, this non-stressed Ge PD can still exhibit intrinsic stress from deposition at elevated temperature and coefficient of temperature mismatch between Ge and substrate/surrounding materials. The Ge PD in FIG. 4A includes many of the same components as the stressed Ge PD in FIG. 1, such as the metal portions 120A-C, the contacts 125A-C, the Ge 110, and the first layer 130 which are encapsulated by the insulator 140. However, unlike the Ge PD in FIG. 1, the first wafer 400 does not include a stressor material below the first layer 130. Further, the first wafer 400 includes a semiconductor substrate 405 (e.g., crystalline silicon or other semiconductor). In one embodiment, the first layer 130, the insulator 140, and the semiconductor substrate 405 can form a buried oxide (BOX) structure. The remaining blocks in the method 300 describe how the first wafer 400 can be processed to form the stressor material and create a stressed Ge PD.

At block 310, a top surface of the first wafer is bonded to a second wafer. That is, a wafer-to-wafer bonding process can be used to bond the first wafer to a second, handler wafer.

Figure 4B:
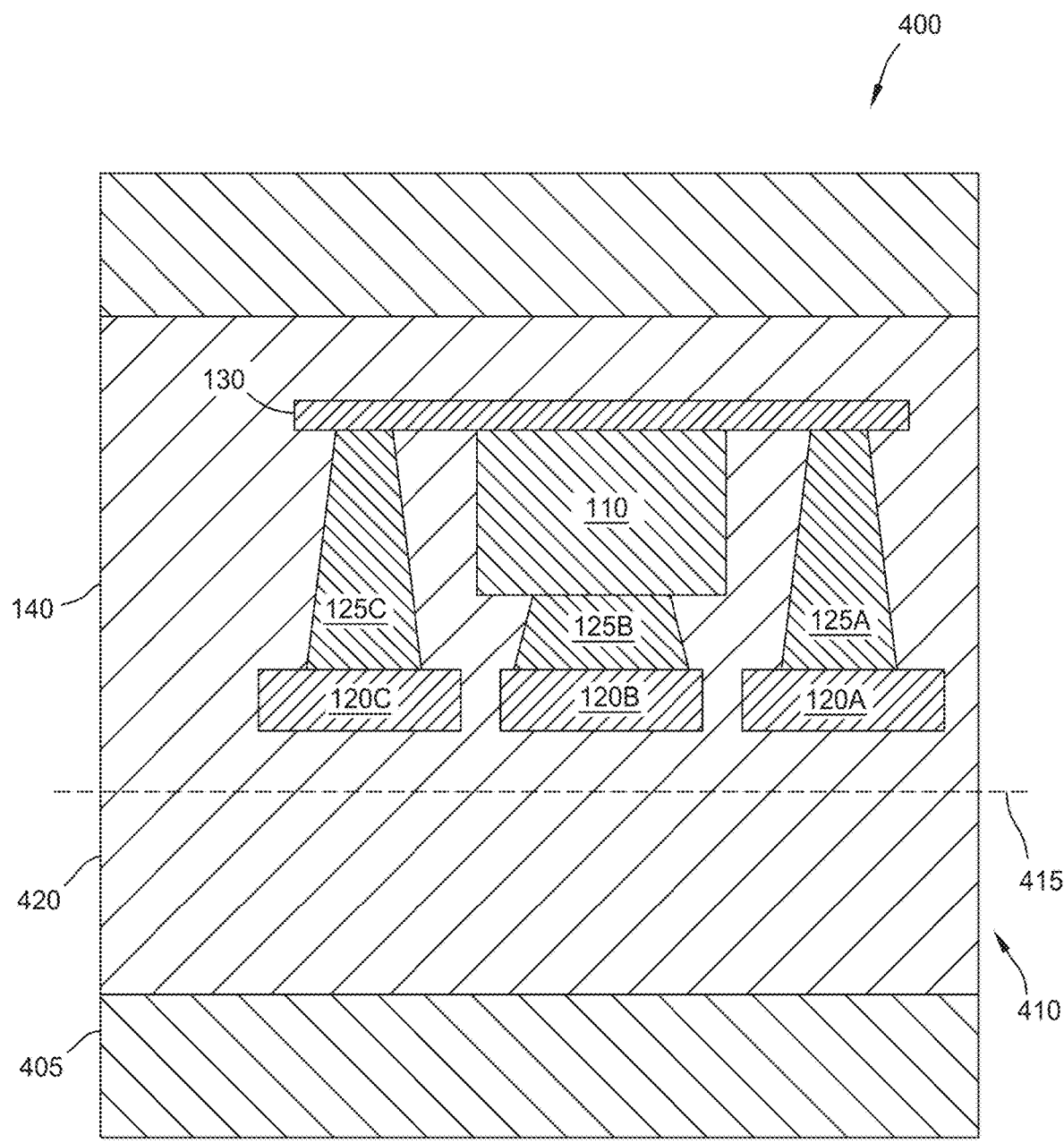

FIG. 4B illustrates the first wafer 400 being bonded to a second wafer 410 at a wafer bond line 415. In this example, the second wafer 410 includes an insulator 420 and semiconductor substrate 425. However, the second wafer 410 can be made of any material (and have any thickness) that provides sufficient stability to the first wafer 400. In one embodiment, the second wafer 410 functions as a handler wafer so that the first wafer 400 can be processed to remove its substrate 405.

In one embodiment, the bond line 415 is an oxide-to-oxide bonding line where the insulator 140 (i.e., an oxide layer) in the first wafer 400 is bonded to the insulator 420 (i.e., an oxide layer) in the second wafer 410. However, the embodiments herein are not limited to any particular type of wafer bonding technique, and can include a metal-to-metal wafer bond using e.g., copper disposed on the top surfaces of the first and second wafers 400, 410.

Further, although direct wafer bonding is a convenient technique for adding support to the first wafer, in another embodiment, the wafers may be bonded by disposing an adhesive between the first and second wafers 400, 410. Further, solder could be used to bond the wafers. Thus, the embodiments herein are not limited to any particular type of wafer bonding technique.

Figure 4C:
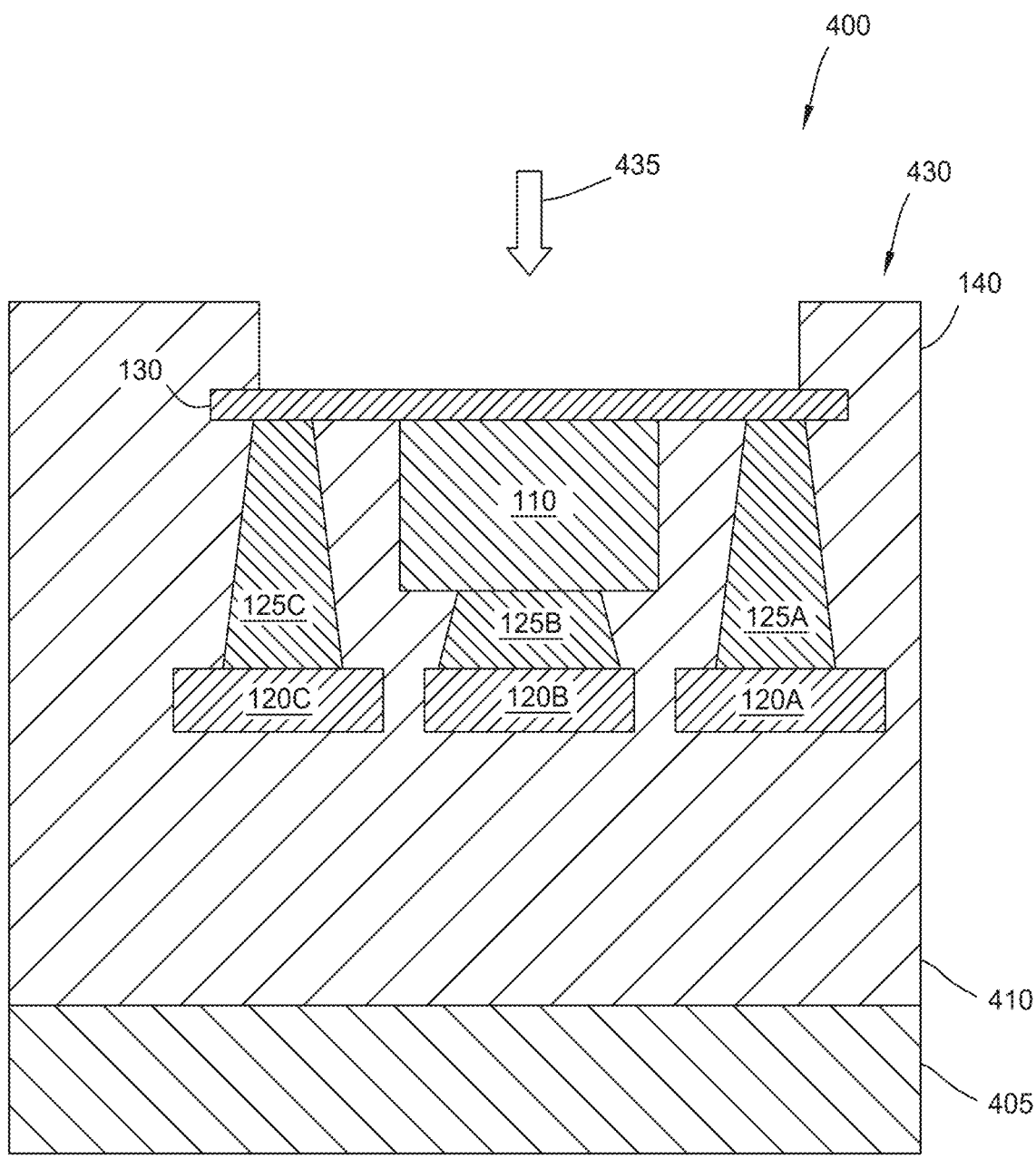

Returning to the method 300, at block 315, the substrate of the first wafer is removed to expose the first layer underneath the Ge. This is shown in FIG. 4C where the substrate 405 on a combined wafer 430 (formed from bonding the first and second wafers) has been removed. This removal can be performed using a wafer grinding processor or a wet or dry etch as shown by the arrow 435.

In addition to remove the substrate 405, a portion of the insulator 140 above the first layer 130 is also removed. For example, first, a planarization process can be used to remove the substrate 405 (and perhaps some of the insulator 140). The planarized layer of the insulator 140 can then be patterned and etched to remove the portion of the insulator 140 above the first layer 130 while keeping the insulator 140 in the surrounding regions as shown in FIG. 4C.

Combining the first wafer and the second wafer provide support when performing this substrate removal process. For example, removing the substrate 405 as shown in FIG. 4C may reduce the first wafer to a thickness of less than a few hundred nanometers. If the first wafer was not first bonded to the second wafer, removing the substrate 405 may cause structural failure in the first wafer.

At block 320, the stressor material is deposited onto the first layer to stress the Ge. The deposited stressor material 440 is deposited along the top surface of the combined wafer 430, where some of the stressor material 440 contacts the first layer 130. In this embodiment, the stressor material 440 directly contacts the first layer 130 (e.g., a crystalline semiconductor layer) which in turn directly contacts the Ge 110. While the first layer 130 may be composed of a single material (e.g., doped/undoped crystalline silicon), the first layer 130 may not be formed entirely of the same material. Or stated differently, the first layer 130 may include multiple different layers of materials, such as a layer of crystalline silicon and an insulation layer. Thus, there may be several layers of different materials in the first layer 130 which separate the stressor material 440 and the Ge 110.

The stressor material 440 may be SiN, diamond-like carbon, SiGe, or any other suitable material for causing a stress in the Ge 110. In one embodiment, a special deposition process is used when depositing the stressor material 440. For example, if SiN is used, a Plasma-enhanced chemical vapor deposition (PECVD) process can be used where a reaction gas flow rate can be adjusted to control the amount of stress the stressor material 440 inhibits onto the Ge 110. That is, the deposition process is adjustable to tune the amount of stress induced by the stressor material 440 on the Ge 110. However, PECVD is just one example technique for depositing a stressor material.

Further, it may be preferable to use an optically transmissive material as the stressor material 440 (e.g., SiN). An optically transmissive material may be less disruptive to the function of the Ge PD since it permits an optical signal to pass there through unlike opaque stressor materials that block light, such as diamond-like carbon.

After the stressor material 440 is deposited, the Ge PD is now a stressed Ge PD. That is, the stressor material 440 generates stress on most (or all) of the combined wafer 430, but more particular on the Ge 110, which alters the bandgap of the Ge 110 and improves its responsivity.

Figure 4D:
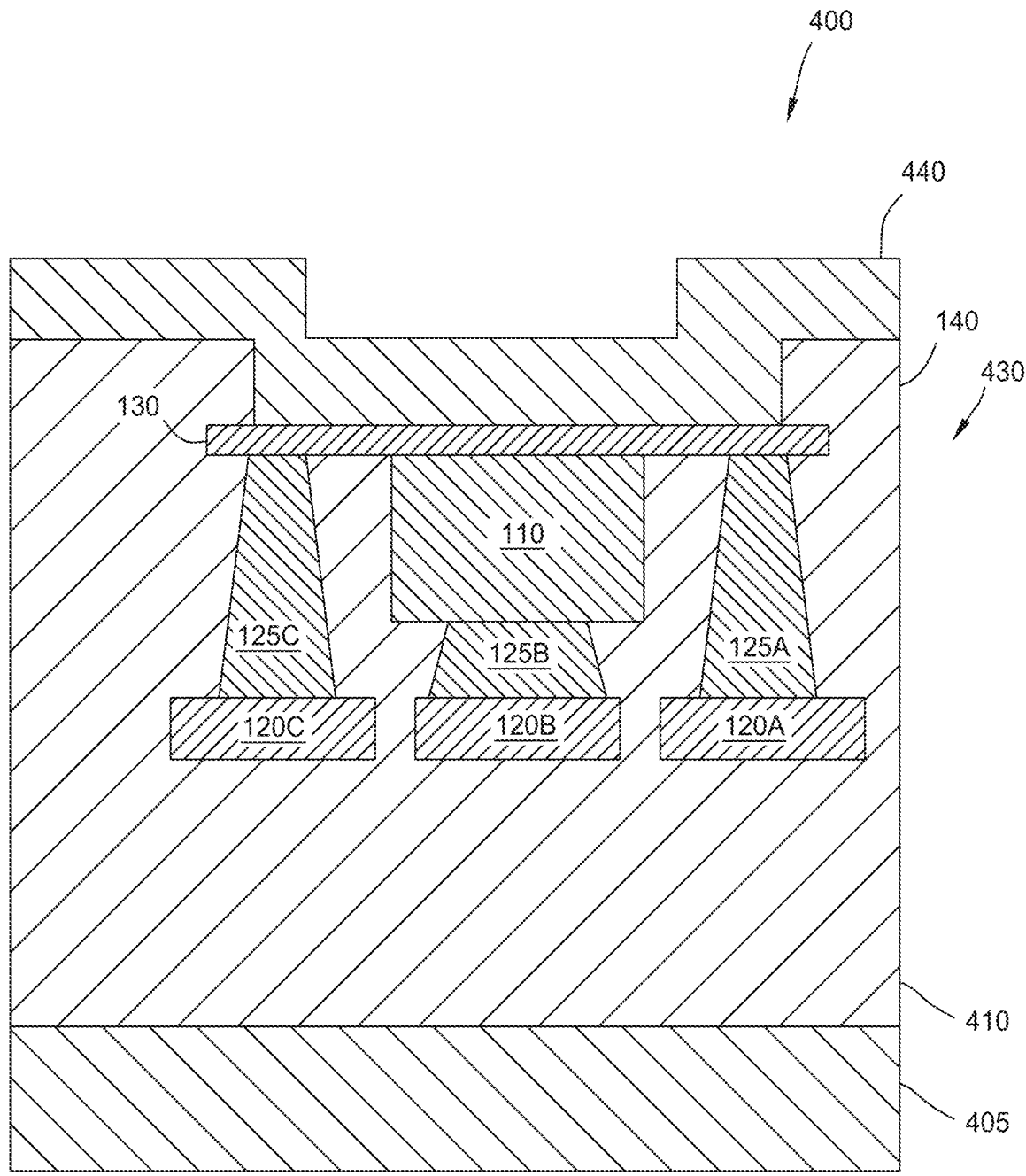
Figure 4E:
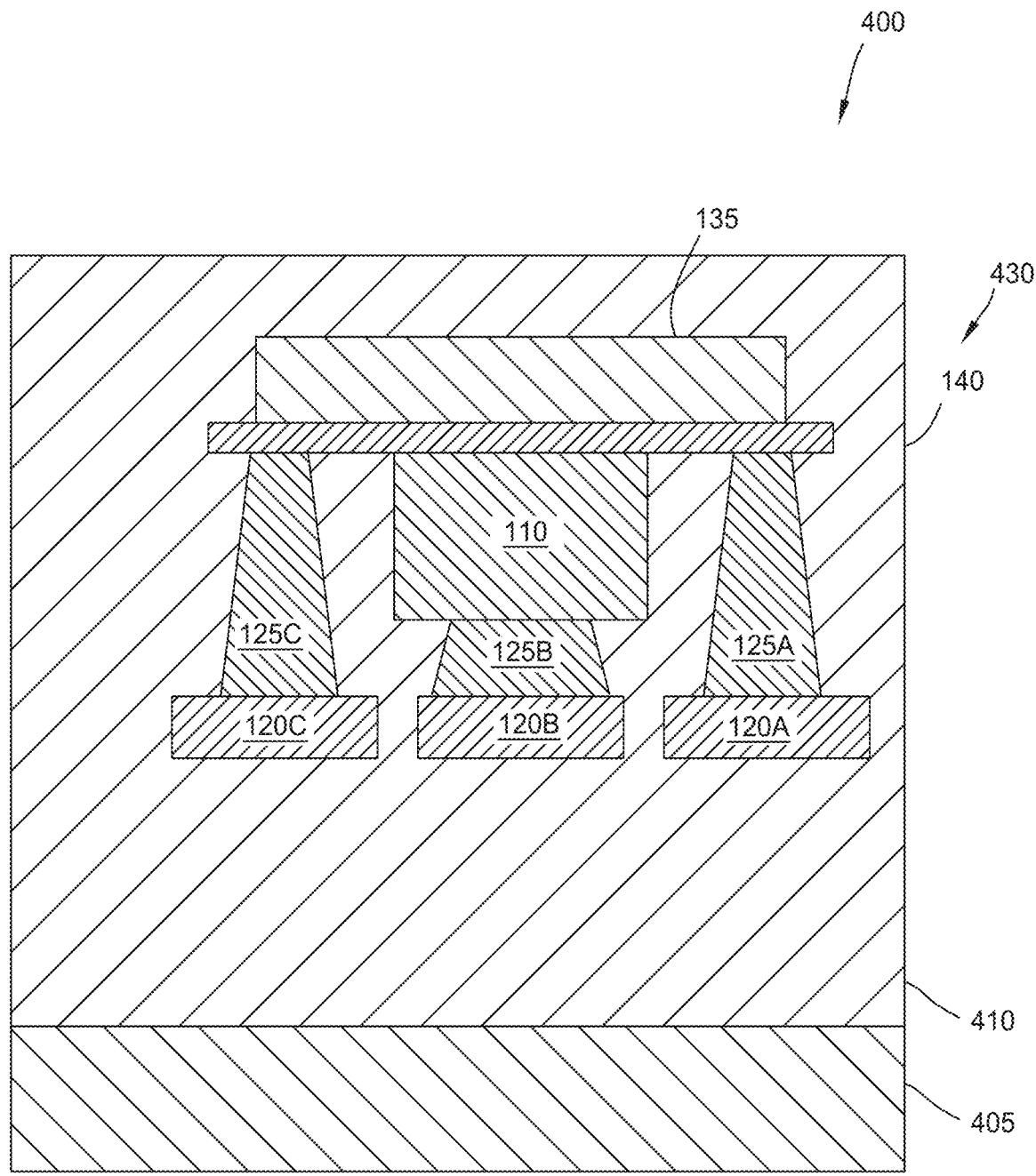

At block 325, the excess stressor material is removed and oxide is formed above the stressor material. FIG. 4E illustrate the result of using a polishing or grinding technique to remove the stressor material in FIG. 4D that was deposited to the sides of the Ge PD. The stressor material 135 in FIG. 4E has the same geometry as the stressor material in FIG. 1. Removing the excess stressor material may limit the amount of stress or strain the stressor material 135 has on the remaining portions of the combined wafer 430, and instead focus or localize the majority of the stress to the Ge PD. This may limit any unintended consequences of depositing the stressor material 135 on the combined wafer 430.

After etching the stressor material 135 to the desired geometry, additional insulator 140 is deposited onto the stressor material 135. This may be used to protect the stressor material 135 and provide a substrate on which additional layers can be deposited.

In one embodiment, the width of the stressor material 135 is equal to, or greater than, the width of the Ge 110. For example, the width of the stressor material 135 may be 10%, 20%, 50%, 100% greater (or more) than the width of the Ge 110.

Figure 5:
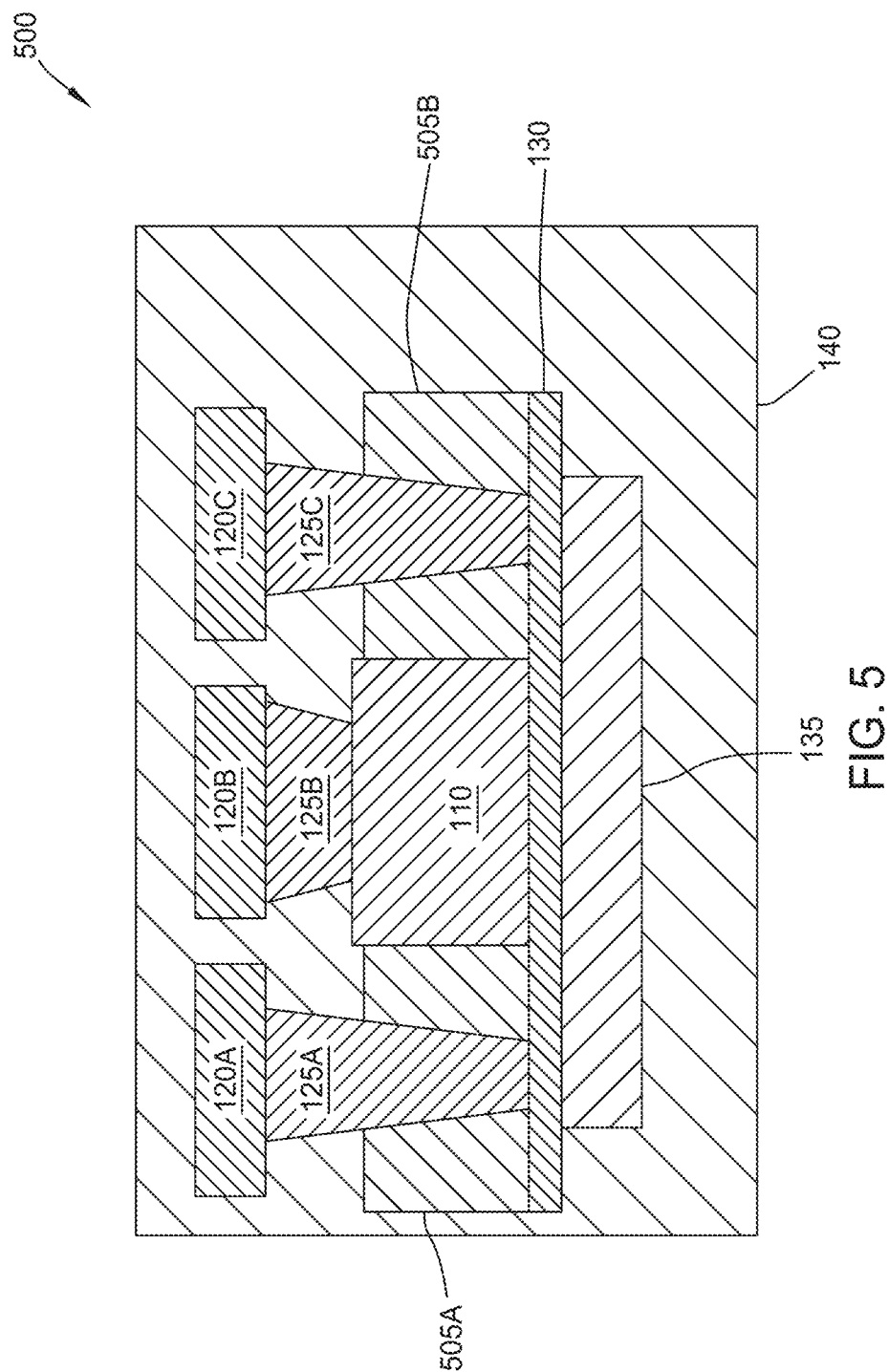
FIG. 5 illustrates a stressed Ge PD, according to one embodiment described herein.

FIG. 5 illustrates a stressed Ge PD 500, according to one embodiment described herein. The PD 500 includes all the same components as the PD 100 in FIG. 1. But the PD 500 also includes side stressor materials 505A and 505B disposed on the left and right sides of the Ge 110, respectively. In this embodiment, these side stressor materials 505A and 505B directly contact the Ge 110, but in other embodiments, a spacer may be formed between the Ge 110 and the side stressor materials 505A and 505B. That is, the side stressor materials 505A and 505B do not need to directly contact the Ge 110 in order to generate a stress on the Ge 110. In one embodiment, the side stressor materials 505A and 505B are the same material as the stressor material 135 disposed on the bottom of the first layer 130, but this is not a requirement and could be formed from different materials.

The side stressor materials 505A and 505B, like the stressor material 135, induce strain or stress on the Ge 110 thereby affecting its bandgap and responsivity. In one embodiment, the side stressor materials 505A and 505B generate a different type of stress on the Ge 110 than the stressor material 135. While the stressor material 135 causes a compression stress that may bend the wafer in a convex or concave manner, the side stressor materials 505A and 505B cause a tensile stress that pulls the Ge 110 to the sides.

Regardless, the stresses applied by the stressor materials 135, 505 can combine to improve the responsivity of the Ge 110.

In one embodiment, the side stressor materials 505A and 505B are formed before the stressor material 135 is deposited. For example, after forming the Ge 110 on the first layer 130, the side stress materials 505A and 505B may be formed on the respective sides of the Ge 110. Vias can then be etched into the side stressor materials 505A and 505B so that the contacts 125A and 125C can be formed. Alternatively, the first layer 130 may be extended to the left and the right such that the contacts 125A and 125C can be formed to the sides of the side stressor materials 505A and 505B rather than being formed through the side stressor materials 505A and 505B as shown in FIG. 5. Because of the side stressor materials 505, the Ge PD 500 is already a stressed PD before the method 300 in FIG. 3 is then used to form the stressor material 135 below the first layer 130.

Figure 6:
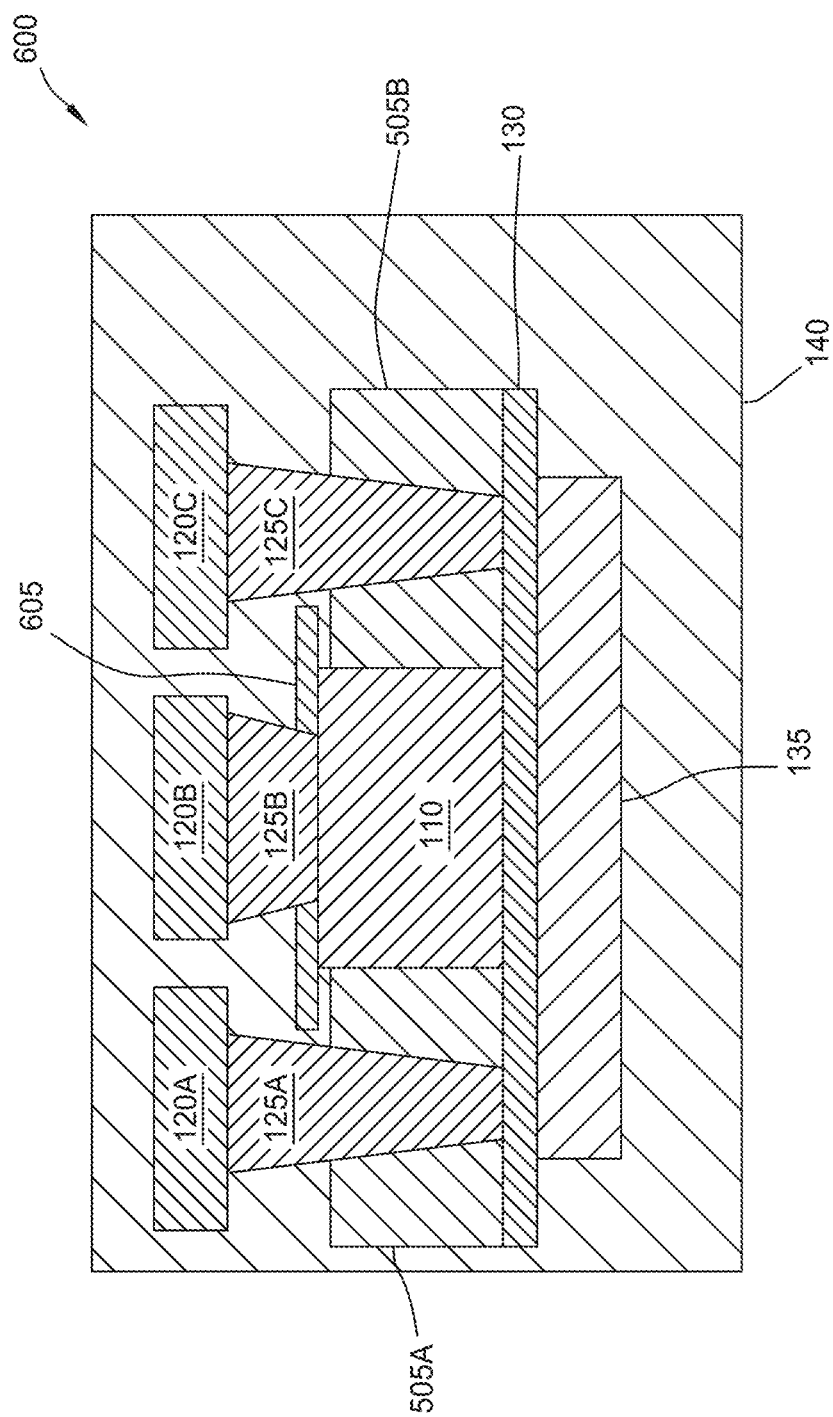
FIG. 6 illustrates a stressed Ge PD, according to one embodiment described herein.

FIG. 6 illustrates a stressed Ge PD, according to one embodiment described herein. The PD 600 includes all the same components as the PD 500 in FIG. 5. But the PD 600 also includes a top stressor material 605 disposed on the top side of the Ge 110 opposite of the side of the Ge 110 facing the stressor material 135. In this embodiment, the top stressor material 605 directly contacts the Ge 110, but in other embodiments, a spacer may be formed between the Ge 110 and the top stressor material 605. That is, the top stressor material 605 does not need to directly contact the Ge 110 in order to generate a stress on the Ge 110. In one embodiment, the top stressor material 605 is the same material as the stressor material 135 disposed on the bottom of the first layer 130 and the side stressor materials 505A and 505B, but this is not a requirement and could be formed from different materials.

The top stressor material 605, like the side stressor materials 505A and 505B and the stressor material 135, induces strain or stress on the Ge 110 thereby affecting its bandgap and responsivity. In one embodiment, the top stressor material 605 generates compressive stress, like the stressor material 135 that may bend the wafer in a convex or concave manner. Regardless, the stresses applied by the stressor materials 135, 505 can combine to improve the responsivity of the Ge 110. In one embodiment, disposing the stressor materials on all sides of the Ge 110 as shown in FIG. 6 can generate a 0.8% tensile strain on the Ge 110.

In one embodiment, the top stressor material 605 is formed before the stressor material 135 is deposited. For example, after forming the Ge 110 on the first layer 130, the side stress materials 505A and 505B may be formed on the respective sides of the Ge 110. The top stressor material 605 can then be formed over the Ge 110, although it may also be possible to form the top stressor material 605 before the side stressor materials 505A and 505B, or form them in the same deposition process(es). A via can then be etched through the top stressor material 605 so that the contact 125B can be formed. Thus, the Ge PD 500 may be a stressed PD because of the top stressor material 605 and the side stressor materials 505 before the method 300 in FIG. 3 is then used to form the stressor material 135 below the first layer 130.

While FIG. 6 illustrates a Ge PD 600 with the top stressor material 605, the side stressor materials 505A and 505B, and the bottom stressor material 135, in another embodiment, the Ge PD 600 may have the top stressor material 605 and the bottom stressor material 135 but not the side stressor materials 505A and 505B.

Further, although not shown explicitly in FIGS. 5 and 6, the first layer 130 and the Ge 110 can be doped as discussed in any of the examples of FIG. 1 to form a vertical PIN junction.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
   forming a germanium photodetector on a substrate, wherein the germanium photodetector contacts a first side of a first layer in the substrate, wherein the germanium photodetector and substrate are disposed in a first wafer;
   bonding the first wafer to a second wafer to form a combined wafer;
   after forming the combined wafer, removing a portion of the substrate to expose a second side of the first layer opposite the first side; and
   depositing, after forming the germanium photodetector on the substrate, a stressor material onto the second side, wherein depositing the stressor material induces a stress that changes an optical absorption edge of the germanium photodetector.

2. The method of claim 1, wherein bonding the first wafer to the second wafer comprises bonding an oxide layer of the first wafer to an oxide layer of the second wafer.

3. The method of claim 1, further comprising, before bonding the first wafer to the second wafer, forming a vertical PIN junction in the first wafer comprising the first layer and the germanium photodetector.

4. The method of claim 3, wherein the first layer comprises a doped silicon layer.

5. The method of claim 1, wherein the stressor material comprises at least one of SiN, diamond-like carbon, or SiGe.

6. The method of claim 1, wherein a width of the stressor material is greater than a width of the germanium photodetector.

7. A method, comprising:
   forming a germanium photodetector on a substrate, wherein the germanium photodetector and the substrate are disposed in a first wafer;
   bonding the first wafer to a second wafer to form a combined wafer;
   after forming the combined wafer, removing a portion of the substrate; and
   depositing, after forming the germanium photodetector on the substrate, a stressor material onto the substrate, wherein a portion of the substrate remains between the stressor material and the germanium photodetector, wherein depositing the stressor material induces a stress that changes an optical absorption edge of the germanium photodetector.

8. The method of claim 7, wherein the portion of the substrate comprises a first layer, wherein the germanium photodetector and the stressor material directly contact opposing sides of the first layer.

9. The method of claim 8, wherein the first layer comprises silicon, wherein the silicon and the germanium photodetector are doped to form a PIN junction.

10. The method of claim 7, wherein bonding the first wafer to the second wafer comprises bonding an oxide layer of the first wafer directly to an oxide layer of the second wafer.

11. A method, comprising:
forming a germanium photodetector on a substrate, wherein the germanium photodetector contacts a first side of a first crystalline semiconductor layer in the substrate;
removing a portion of the substrate to expose a second side of the first crystalline semiconductor layer opposite the first side; and
depositing, after forming the germanium photodetector on the substrate, a stressor material onto the second side, wherein depositing the stressor material induces a stress that changes an optical absorption edge of the germanium photodetector.

12. The method of claim 11, wherein the germanium photodetector and the substrate are part of a first wafer, further comprising: bonding an oxide layer of the first wafer to an oxide layer of a second wafer.

13. The method of claim 12, further comprising, before bonding the first wafer to the second wafer, forming a vertical PIN junction in the first wafer comprising the first crystalline semiconductor layer and the germanium photodetector.

14. The method of claim 11, wherein the stressor material comprises at least one of SiN, diamond-like carbon, or SiGe.

15. The method of claim 11, wherein a width of the stressor material is greater than a width of the germanium photodetector.

* * * * *